United States Patent [19]
Kanasugi

[11] Patent Number: 6,163,219
[45] Date of Patent: Dec. 19, 2000

[54] AMPLIFICATION CIRCUIT AND INTEGRATED CIRCUIT HAVING SUCH AND CONTROLLING METHOD OF THE AMPLIFICATION CIRCUIT

[75] Inventor: Masami Kanasugi, Kawasaki, Japan

[73] Assignee: Fujitsu Limited, Kawasaki, Japan

[21] Appl. No.: 09/301,286

[22] Filed: Apr. 28, 1999

[30] Foreign Application Priority Data

Sep. 17, 1998 [JP] Japan .................. 10-263580

[51] Int. Cl.⁷ .............. H03G 3/12; H03G 3/10; H03F 1/36
[52] U.S. Cl. .............. 330/282; 330/285; 330/86
[58] Field of Search .............. 330/86, 282, 285

[56] References Cited

U.S. PATENT DOCUMENTS

| | | | |
|---|---|---|---|
| 3,553,490 | 1/1971 | Darrow | 330/86 |
| 4,216,434 | 8/1980 | Wermuth | 330/86 |
| 4,450,413 | 5/1984 | Fujibayashi | 330/282 |
| 5,703,529 | 12/1997 | Ghaffaripour et al. | 330/51 |

*Primary Examiner*—Robert Pascal
*Assistant Examiner*—Patricia T. Nguyen
*Attorney, Agent, or Firm*—Armstrong, Westerman, Hattori, McLeland & Naughton

[57] ABSTRACT

An amplification circuit includes an amplifying unit to which a signal supplied via an AC coupling capacitor is input, the amplifying unit starting an amplifying operation for the input signal when a potential level at an input portion of the amplifying unit reaches an operating threshold level from a predetermined low level, and a feedback resistor circuit, provided in a feedback line through which electric charge is fed back to the input portion of the amplifying unit, in which feedback resistor circuit a resistance value is controllable by a control signal supplied from an outside thereof.

18 Claims, 12 Drawing Sheets

FIG. 1

PRIOR ART

AMPLIFICATION CIRCUIT AND INTEGRATED CIRCUIT HAVING SUCH AND CONTROLLING METHOD OF THE AMPLIFICATION CIRCUIT

BACKGROUND OF THE INVENTION

1. Field of the Invention

The present invention relates to an amplification circuit, and more particularly to an amplification circuit, having a feedback resistor circuit and a power-save circuit, which amplifies analog signals input thereto via an AC coupling capacitor. The present invention also relates to an integrated circuit having the amplification circuit.

2. Description of the Related Art

In recent years, an LSI chip in which analog circuits and digital circuits are formed as a system-on chip to provide many functions and operate at a high speed has been proposed. In such an LSI chip, an amplification circuit in which a feedback circuit and a power-save circuit are arranged is often provided. The amplification circuit efficiently amplifies analog signals input thereto via an AC coupling capacitor. It is desired that such an amplification circuit can operate at a further high speed and a starting time of the amplification circuit can be shortened.

Figure 1:
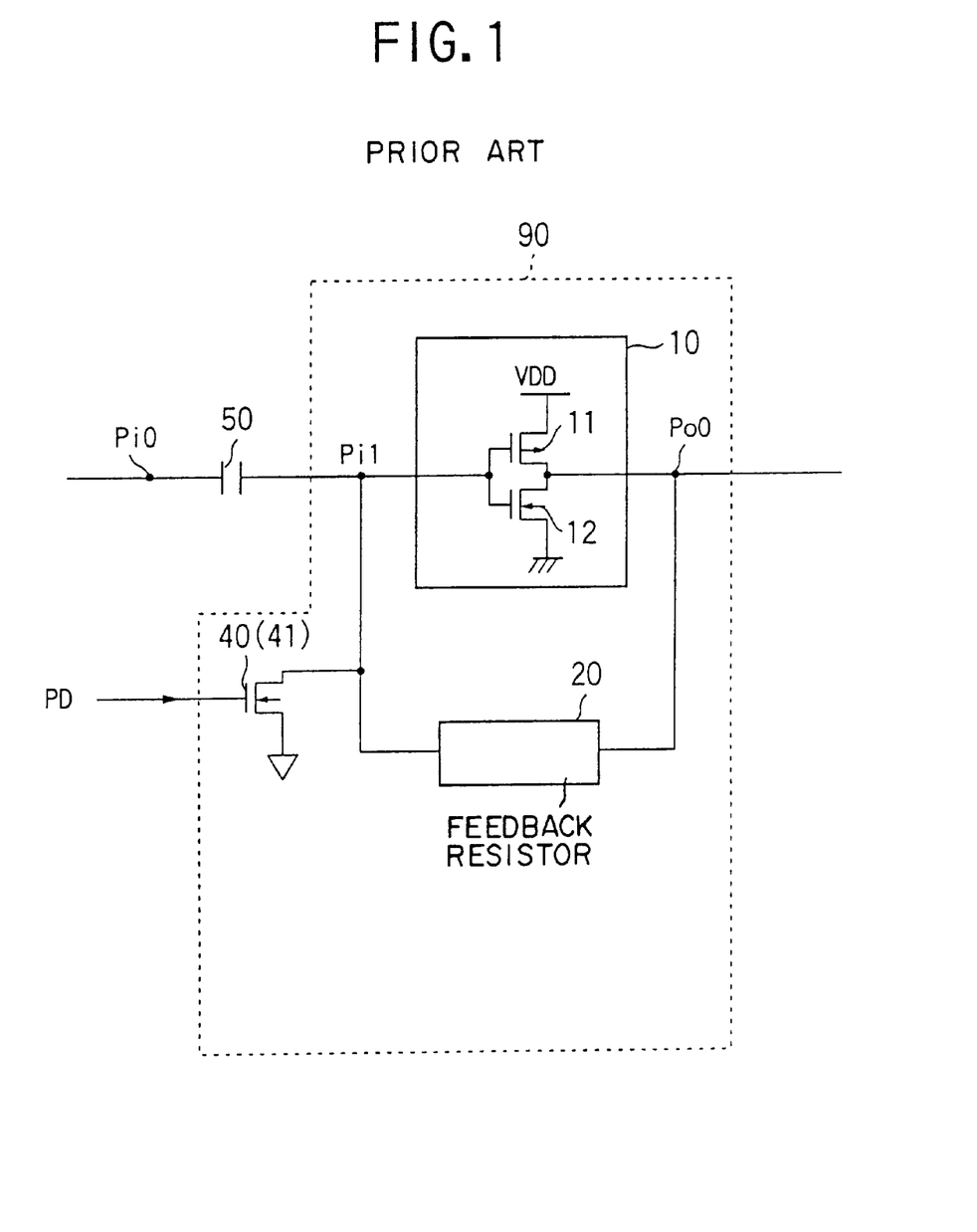
FIG. 1 is a circuit diagram illustrating a conventional amplification circuit.

A conventional amplification circuit is formed as shown in FIG. 1. Referring to FIG. 1, an amplification circuit 90 amplifies analog signals input thereto via an AC coupling capacitor 50. The amplification circuit 90 has an amplifying unit 10, a feedback resistor 20 and a power-save circuit 40.

The feedback resistor 20 is provided in a feedback line of the amplifying unit 10 formed of a P-channel transistor 11 and an N-channel transistor 12. An operating threshold level of the amplifying unit 10 depends on a level (e.g., about ½ VDD) at which drain currents of the N-channel transistor 12 P-channel transistor 11 are balanced by the feedback resistor 20. In the amplification circuit 90, the larger the resistance value of the feedback resistor 20, the larger the signal amplification factor of the amplifying unit 10. Thus, the feedback resistor 20 is set at a value as large as possible.

The power-save circuit 40 clamps the potential level at an input node Pi1 at zero to decrease the consumed power of the amplification circuit 90. In the power-save circuit 40, the source terminal of an N-channel transistor 41 is grounded. The power-save circuit 40 is provided with a power-save signal PD from an external unit. When the power-save signal PD has a high level, the transistor 41 is in an on state, so that the potential level at the input node Pi1 to which the signal is input is clamped at zero. When the potential level at the input node Pi1 is zero, the P-channel transistor 11 is in the on state and the N-channel transistor is in the off state, so that the output node Po0 has the potential level equal to VDD.

When the amplification circuit is activated, the power save signal PD becomes the low level so that the transistor 41 is turned off. The electric charge is thus supplied from the output node Po0 having the potential level of VDD to the input node Pi1 having the potential level of zero via the feedback resistor 20. The potential level at the input node Pi1 is restored to about ½ VDD which is the operating threshold level of the amplifying unit 10. While the electric charge is being supplied to the input node Pi1, the potential level at the output node Po0 is decreased to about ½ VDD so as to be balanced with the potential level at the input node Pi1.

When the potential level at the input node Pi1 reaches the operating threshold level of the amplifying unit 10, the amplifying unit 10 starts the amplifying operation. As a result, an analog signal input to the amplifying unit 10 via the AC coupling capacitor 50 is inverted and amplified. The output signal of the amplifying unit 10 is output via the output node Po0.

In the conventional amplification circuit 90 as described above, in order to restore the potential level at the input node Pi1 from the clamped level of zero to the operating threshold level, the electric charge passes through the feedback resistor 20 which is set at a value as large as possible to obtain a large signal amplification factor and a low consumed power. Thus, a long restoring time is needed to restore the potential level at the input node Pi1 to the operation threshold level.

SUMMARY OF THE PRESENT INVENTION

Accordingly, a general object of the present invention is to provide a novel and useful amplification circuit in which the disadvantages of the aforementioned prior art are eliminated.

A specific object of the present invention is to provide an amplification circuit in which the potential level at an input portion thereof can be rapidly controlled reach to the operating threshold level without decreasing the signal amplification factor.

The above objects of the present invention are achieved by an amplification circuit comprising: an amplifying unit to which a signal supplied via an AC coupling capacitor is input, the amplifying unit starting an amplifying operation for the input signal when a potential level at an input portion of the amplifying unit reaches an operating threshold level from a predetermined low level; and a feedback resistor circuit, provided in a feedback line through which electric charge is fed back to the input portion of the amplifying unit, in which feedback resistor circuit a resistance value is controllable by a control signal.

According to the present invention, since the resistance value of the feedback resistor circuit is controllable by the control signal, the resistance value of the feedback resistor circuit can be controlled at a low value when a state where the potential level at the input portion of the amplifying unit is maintained at the predetermined low level (e.g., zero) is released. In this state, the electric charge can be rapidly supplied to the input portion via the feedback resistor circuit having the low resistance value, so that the potential level at the input portion of the amplifying unit can rapidly reach the operating threshold level. Thus, the amplifying unit can rapidly start the amplifying operation.

In addition, the resistance value of the feedback resistor circuit can be controlled at a high value when the potential level at the input portion of the amplifying unit reaches the operating threshold level. In this case, the amplifying unit can perform the amplifying operation with a low consumed power and a high signal amplification factor.

Another object of the present invention is to provide a semiconductor integrated circuit having the above amplification circuit.

The object of the present invention is achieved by a semiconductor integrated circuit comprising: a plurality of circuits which have predetermined functions; and an amplification circuit coupled to one of the plurality of circuits as an input circuit for the one of the plurality of circuits, the amplification circuit comprising: an amplifying unit to which a signal supplied via an AC coupling capacitor is input, the amplifying unit starting an amplifying operation for the input signal when a potential level at an input portion of the amplifying unit reaches an operating threshold level from a predetermined low level; and a feedback resistor circuit, provided in a feedback line through which electric charge is fed back to the input portion of the amplifying unit, in which feedback resistor circuit a resistance value is controllable by a control signal.

A further object of the present invention is to provide a control method of the above amplification circuit.

The object of the present invention is achieved by a method for controlling an amplification circuit having an amplifying unit to which a signal supplied via an AC coupling capacitor is input, the amplifying unit starting an amplifying operation for the input signal when a potential level at an input portion of the amplifying unit reaches an operating threshold level from a predetermined low level; and a feedback resistor circuit, provided in a feedback line through which electric charge is fed back to the input portion of the amplifying unit, in which feedback resistor circuit a resistance value is controllable by a control signal, the method comprising of the steps of: (a) maintaining a state where the potential level at the input portion of the amplifying unit is maintained at the predetermined low level; (b) controlling the resistance value of the feedback resistor circuit at a first value when the state of the potential level at the input portion of the amplifying unit is released; and (c) controlling the resistance value of the feedback resistor circuit at a second value larger than the first value when the potential level of the input portion of the amplifying unit reaches the operating threshold level.

BRIEF DESCRIPTION OF THE DRAWINGS

Other objects, features and advantages of the present invention will be apparent from the following description when read in conjunction with the accompanying drawings, in which.

DESCRIPTION OF THE PREFERRED EMBODIMENTS

A description will be given, with reference to the drawings, of embodiments of the present invention.

Figure 2:
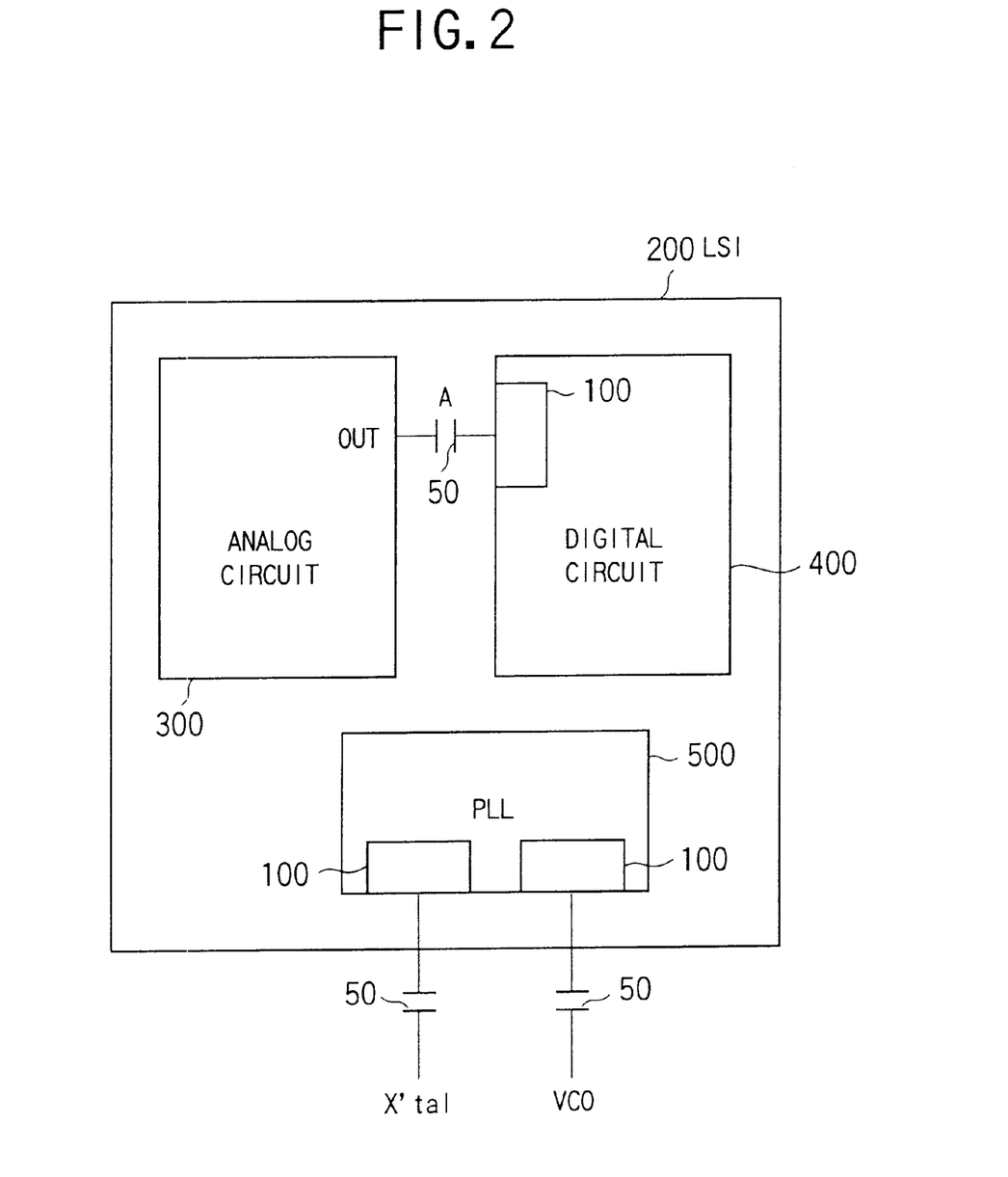
FIG. 2 is a block diagram illustrating an integrated circuit in which an amplification circuit is mounted.

An amplification circuit according to the present invention is provided in a semiconductor integrated circuit (hereinafter, referred to as an LSI chip) as shown in FIG. 2.

An LSI 200 shown in FIG. 2 is formed as a system-on-chip to operate at a high speed and to provide many functions. The LSI chip 200 is provided with an analog circuit 300, a digital circuit 400 and a PLL (Phase-Locked Loop) 500. An amplification circuit 100 according to the present invention is provided in each of the digital circuit 400 and the PLL 500. An analog signal A from the analog circuit 300 is input to the digital circuit 400 via an AC coupling capacitor 50. Analog signals X'tal and VCO are respectively supplied from external units to the PLL 500 via AC coupling capacitors 50. The analog signals A, X'tal and VCO respectively input to the amplification circuits 100 via the AC coupling capacitors 50 are amplified by the amplification circuits 100 and then processed by the digital circuit 400 and the PLL 500. The amplification circuits 100 according to the present invention may be provided in a circuit, other than the digital circuit 400 and the PLL 500, having an analog input portion to which analog signals are input via the AC coupling capacitor 50. In addition, the amplification circuits 100 may be provided in the LSI chip 200 separately from the other circuits (the digital circuit 400 and the PLL 500). In this case, output signals from the amplification circuits 100 to which the analog signals are input via the AC coupling capacitors 50 are input to the other circuits.

A description will now be given, with reference to FIGS. 3 and 4, of the amplification circuit according to a first embodiment of the present invention.

Figure 3:
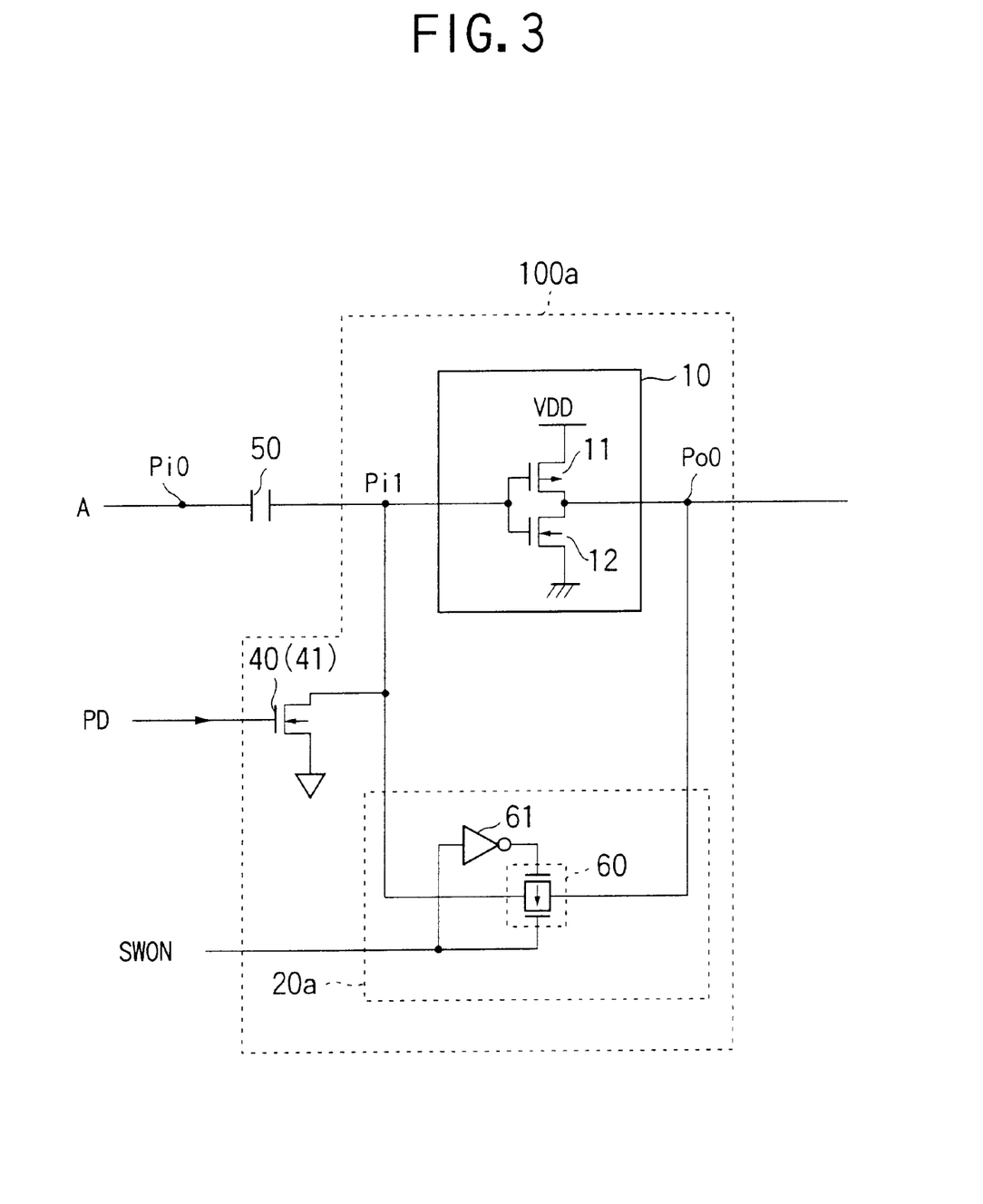
FIG. 3 is a circuit diagram illustrating an amplification circuit according to a first embodiment of the present invention.

Referring to FIG. 3, an amplification circuit 100a has an amplifying unit 10, a feedback resistor circuit 20a and a power-save circuit 40.

The amplifying unit 10 is an inverter amplifier formed of a P-channel transistor 11 and an N-channel transistor 12. A power supply voltage VDD is applied to a source terminal of the P-channel transistor 11. A source terminal of the N-channel transistor 12 is grounded. The amplification circuit 100a is mounted, for example, in the digital circuit 400 shown in FIG. 2. In this case, the analog signal A output by the analog circuit 300 shown in FIG. 2 is supplied to the amplifying unit 10 via the AC coupling capacitor 50 and an input node Pi1. The analog signal A is thus inverted and amplified by the amplifying unit 10. An output signal of the amplifying unit 10 is output from the amplification circuit 100a via an output node Po0.

The feedback resistor circuit 20a is provided in a feedback line of the amplifying unit 10. An operating threshold level of the amplifying unit 10 depends on a resistance value of the feedback resistor circuit 20a. The larger the resistance value of the feedback resistor circuit 20a, the larger the signal amplification factor of the amplifying unit 10. Thus, when the amplifying unit 10 amplifies an signal, the resistance value of the feedback resistor circuit 20a is set at a large value. The feedback resistor circuit 20a is formed of a transfer gate 60 and an inverter 61. An activating signal SWON is supplied from a CPU (not shown), provided outside of the amplification circuit 100a, to the feedback resistor circuit 20a. When the activating signal SWON having a high level is supplied to the feedback resistor circuit 20a, the transfer gate 60 is turned on so that a current flows.

The power-save circuit 40 is used to decrease consumed power of the amplification circuit 100a. The power-save circuit 40 is formed of an N-channel transistor 41 in which the source terminal is grounded. The power-save circuit 40 is provided with a power-save signal PD from the CPU. When the power-save signal has a high level, the transistor 41 is turned on so that a potential at the input node Pi1 is controlled to be zero (a ground level GND).

A description will now be given, with reference to FIG. 4, of operations of the amplification circuit 100a.

First, in a period (1), the power-save signal PD having the high level is supplied to the power-save circuit 40. The transistor 41 of the power-save circuit 40 is then turned on so that the potential at the input node Pi1 is clamped at zero. When the potential at the input node Pi1 is clamped at zero, the transistor 11 of the amplifying unit 10 is in an on state and the transistor 12 is in an off state. Thus, the potential at the output node Po0 is maintained at the same level as the power supply voltage VDD.

Next, in a period (2) in which the amplification circuit 100a is activated, the powersave signal PD having the low level is supplied to the power-save circuit 40. Simultaneously, the activating signal SWON having the high level is supplied to the feedback resistor circuit 20a, so that the transfer gate 60 is turned on. At this time, electric charge is rapidly supplied from the output node Po0 having the potential level of VDD via the feedback resistor circuit 20a to the input node Pi1 having the potential level of zero, so that the potential level at the input node Pi1 is rapidly restored to about ½ VDD which is the operating threshold level of the amplifying unit 10. While the electric charge is being supplied to the input node Pi1, the potential level at the output node Po0 is decreased to about ½ VDD so as to be balanced with the potential level at the input node Pi1. After the potential levels at the output node Po0 and the input node Pi1 have been balanced, the activating signal SWON turns to the low level, so that the transfer gate 60 is turned off. A time period needed to balance the potential levels at the input node Pi1 and the output node Po0 with each other depends on the capacity of the capacitor 50 and the resistance value of the feedback resistor circuit 20a controlled in the period (2).

Then, in a period (3) after the transfer gate 60 is turned off, a leakage current of the transfer gate 60 is used as a feedback current. After the signal A input to the amplification circuit 100a via the capacitor 50 is inverted and amplified by the amplifying unit 10, the output signal of the amplifying unit 10 is output from the amplification circuit 100a via the output node Po0.

As has been described above, since the transfer gate 60 is turned on so that the potential level at the input node Pi1 is restored to about ½ VDD which is the operating threshold level and the leakage current of the transfer gate 60 which is turned off after the potential level at the input node Pi1 is restored is used as the feedback current, the amplification circuit 100a can operate at a high speed and with a high amplification factor and a low consumed power.

A description will now be given, with reference to FIG. 5, of the amplification circuit according to a second embodiment of the present invention.

Figure 5:
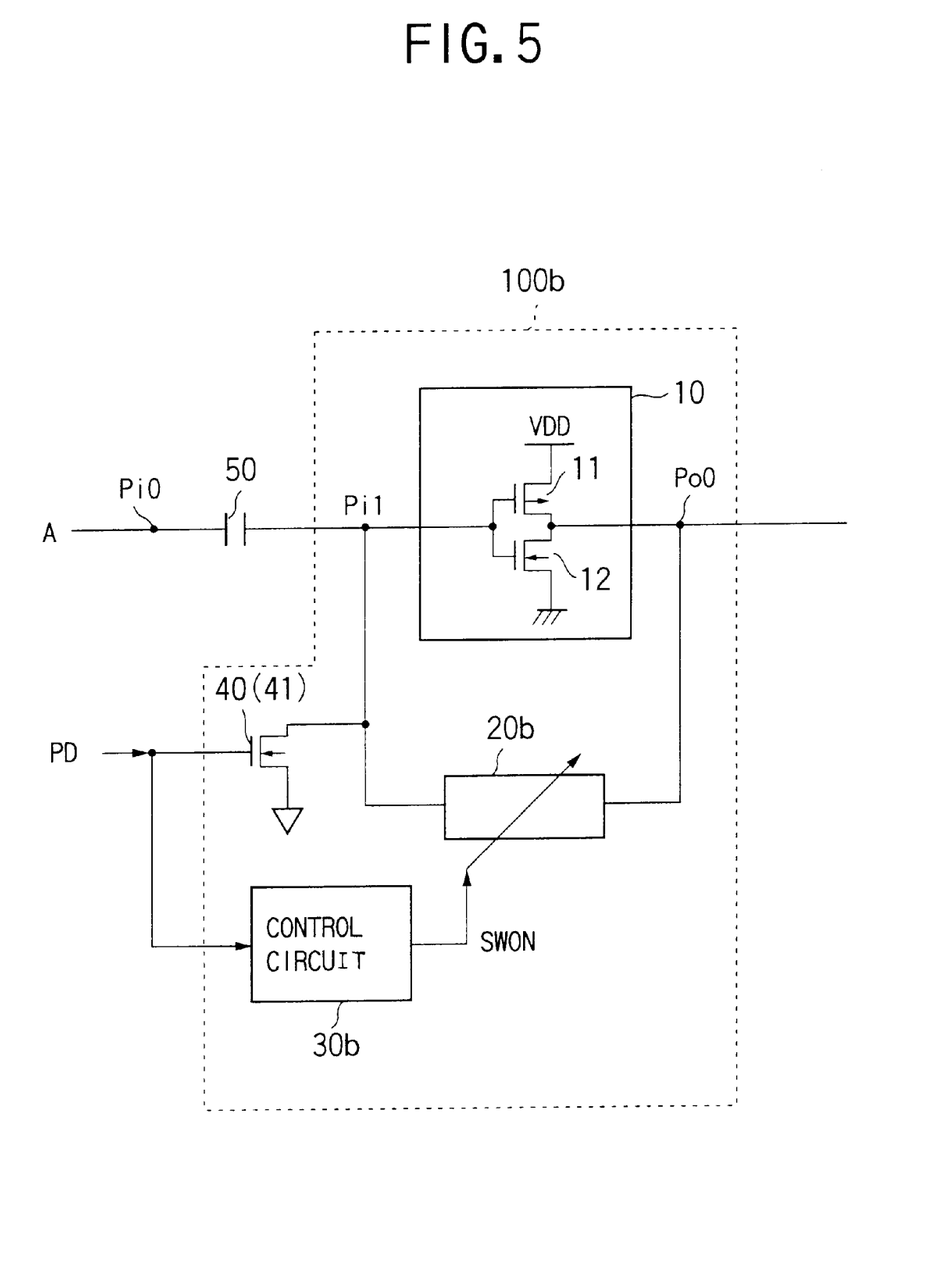
FIG. 5 is a circuit diagram illustrating an amplification circuit according to a second embodiment of the present invention.

Referring to FIG. 5, an amplification circuit 100b has the amplifying unit 10, a feedback resistor circuit 20b, a control circuit 30b and the power-save circuit 40.

The feedback resistor circuit 20b is provided in the feedback line of the amplifying unit 10. The feedback resistor circuit 20b is formed of an adjustable resistor. The operating threshold level of the amplifying unit 10 depends on a resistance value of the variable resistor. The larger the variable resistor, the larger the signal amplification factor of the amplifying unit 10. Thus, when the amplifying unit 10 amplifies an signal, the variable resistor of the feedback resistor circuit 20b is controlled to be a large resistance value.

The control circuit 30b is provided with the power-save signal PD. When the power-save signal PD is changed from the high level to the low level, the control circuit 30b supplies the activating signal SWON having the high level to the feedback resistor circuit 20b. Due to the activating signal SWON having the high level, the resistance value of the adjustable resistor of the feedback resistor circuit 20b is decreased.

The amplifying unit 10 and the power-save circuit 40 are the same as those in the first embodiment. Thus, explanations of the structures of the amplifying unit 10 and the power-save circuit 40 are omitted.

A description will now be given, with reference to FIG. 4, of operations of the amplification circuit 100b.

First, in the period (1), when the power-save signal PD having the high level is supplied to the power-save circuit 40, the transistor 41 is turned on, so that the potential level at the input node Pi1 is clamped at zero. At this time, the transistor 11 of the amplifying unit 10 is turned on and the transistor 12 is turned off, so that the potential level at the output node Po0 is the same as the power supply voltage VDD.

Next, in the period (2), the power-save signal having the low level is supplied to the power-save circuit 40 and the control circuit 30b.

The control circuit 30 supplies the activating signal SWON having the high level to the feedback resistor circuit 20b when receiving the power-save signal having the low level. Due to the activating signal SWON having the high level, the resistance value of the adjustable resistor of the feedback resistor circuit 20b is decreased by a predetermined amount. At this time, since the transistor 41 is turned off, the electric charge is rapidly supplied from the output node Po0 having the potential level of VDD to the input node Pi1 having the potential level of zero via the adjustable resistor of the feedback resistor circuit 20b in which the resistance value is decreased by the predetermined amount. The potential level at the input node Pi1 is thus rapidly restored to the level of about ½ VDD which is the operating threshold level of the amplifying unit 10. While the electric charge is being supplied to the input node Pi1, the potential level at the output node Po0 is decreased to about ½ VCC so as to be balanced with the potential level at the input node Pi1.

A time period needed to balance the potential levels at the input node Pi1 and the output node Po0 with each other depends on the capacitance value of the AC coupling capacitor 50 and the resistance value of the adjustable resistor of the feedback resistor circuit 20b which has been decreased by the control circuit 30b.

When the potential level at the input node Pi1 reaches about ½ VDD, the control circuit 30b supplies the activating signal SWON having the low level to the feedback resistor circuit 30. Due to the activating signal SWON having the low level, the resistance value of the adjustable resistor of the feedback resistor circuit 20b is returned to the same value as in the period (1). Then, in the period (3), the signal A input to the amplification circuit 100*b* via the AC coupling capacitor 50 is inverted and amplified by the amplifying unit 10. The output signal of the amplifying unit 10 is output from the amplification circuit 100*b* via the output node Po0.

As has been described above, since the resistance value of the feedback resistor circuit 20*b* is decreased by the control circuit 30*b* so that the potential level at the input node Pi1 is rapidly restored to the operating threshold level of the amplifying unit 10, the time period needed to balance the potential levels at the input node Pi1 and the output node Po0 with each other can be decreased. Thus, the amplifying operation of the amplification circuit 100*b* can rapidly start. In addition, when the amplification circuit 100*b* amplifies the input signal, the control circuit 30*b* controls the feedback resistor circuit 20*b* so that the resistance value of the adjustable resistor is returned to the high value. Thus, the amplification circuit 100*b* can operate with a low consumed power and a high amplification factor. Further, since the control circuit 30*b* generates the activating signal SWON based on the power-save signal PD, the amplification circuit 100*b* can be controlled by only the power-save signal PD.

A description will now be given, with reference to FIG. 6, of the amplification circuit according to a third embodiment of the present invention.

Figure 6:
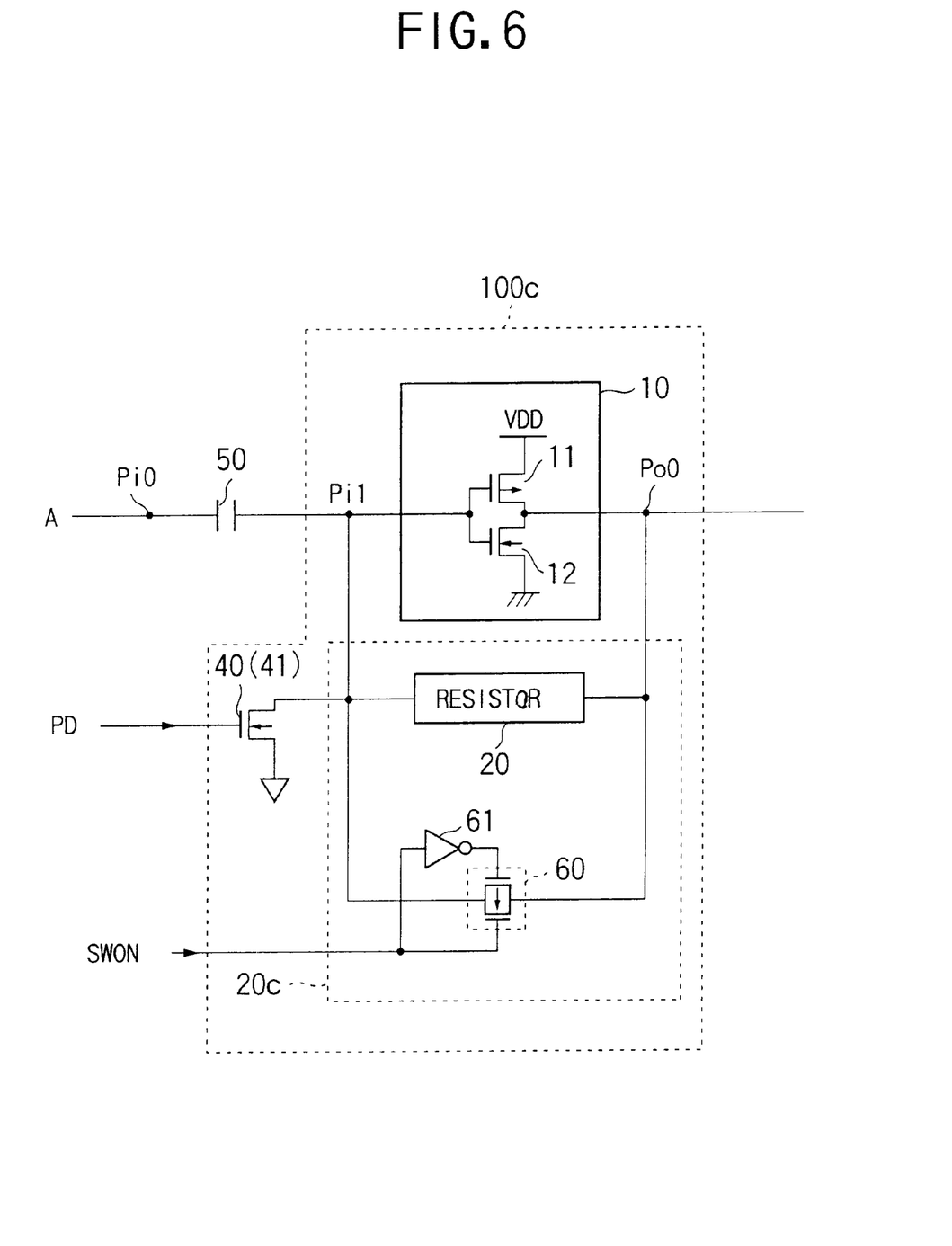
FIG. 6 is a circuit diagram illustrating an amplification circuit according to a third embodiment of the present invention.

Referring to FIG. 6, an amplification circuit 100*c* has the amplifying unit 10, a feedback resistor circuit 20*c* and the power-save circuit 40.

The feedback resistor circuit 20*c* is provided in the feedback line of the amplifying unit 10. The feedback resistor circuit 20*c* has a resistor 20, the transfer gate 60 and the inverter 61. The resistor 20 and a resistor unit formed of the transfer gate 60 and the inverter 61 are connected in parallel. The operating threshold level of the amplifying unit 10 depends on a combined resistance value of the resistor 20 and the resistor unit of the transfer gate 60 and the inverter 61. Since the larger the combined resistance value, the larger the signal amplification factor of the amplifying unit 10, the combined resistance value is set at a large value.

The amplifying unit 10 and the power-save circuit 40 have the same structures as those indicated in the first embodiment. Thus, the explanations of the amplifying unit 10 and the power-save circuit 40 are omitted.

In the amplification circuit 100*c*, in the period (2) in which the potential level at the input node Pi1 is restored, after the period (1) in which the potential level at the input node Pi1 is clamped at zero, the activating signal SWON having the high level is supplied to the resistor unit formed of the transfer gate 60 and the inverter 61 and the power-save signal PD having the low level is supplied to the power-save circuit 40. At this time, the transfer gate 60 is turned on so that the resistance value of the resistor unit including the transfer gate 60 is decreased by a predetermined amount. That is, the combined resistance value of the feedback resistor circuit 20*c* is decreased. Thus, the electric charge is rapidly supplied from the output node Po0 having the potential level of VDD to the input node Pi1 having the potential level of zero. As a result, the potential level at the input node Pi1 is rapidly restored to about ½ VDD which is the operating threshold level of the amplifying unit 10. While the electric charge is being supplied to the input node Pi1, the potential level at the output node Po0 is decreased to about ½ VDD so as to be balanced with the potential level at the input node Pi1.

Then, in the period (3), since the activating signal SWON supplied to the resistor unit including the transfer gate 60 becomes the low level, the transfer gate 60 is turned off. The resistance value of the resistor unit including the transfer gate 60 returns to the original value in the period (1). That is, the combined resistance value of the feedback resistor circuit 20*c* returns to an original value. In this state, the signal A input to the amplification circuit 100*c* via the AC coupling capacitor 50 is inverted and amplified by the amplifying unit 10. The output signal of the amplifying unit 10 is output via the output node Po0.

As has been described above, the transfer gate 60 is turned on by the activating signal SWON, having the high level, supplied to the feedback resistor circuit 20*c* so that the potential level of zero at the input node Pi1 is rapidly restored to the operating threshold level of the amplifying unit 10. Thus, the amplifying operation of the amplification circuit 100*c* can rapidly start. In addition, since when the amplification circuit 100*c* amplifies the signal, the transfer gate 60 is turned off so that the resistance value of the feedback resistor circuit 20*c* returns to the original value, the amplification circuit 100*c* can operate with a low consumed power and a high signal amplification factor.

A description will now be given, with reference to FIG. 7, of the amplification circuit according to a fourth embodiment of the present invention.

Figure 7:
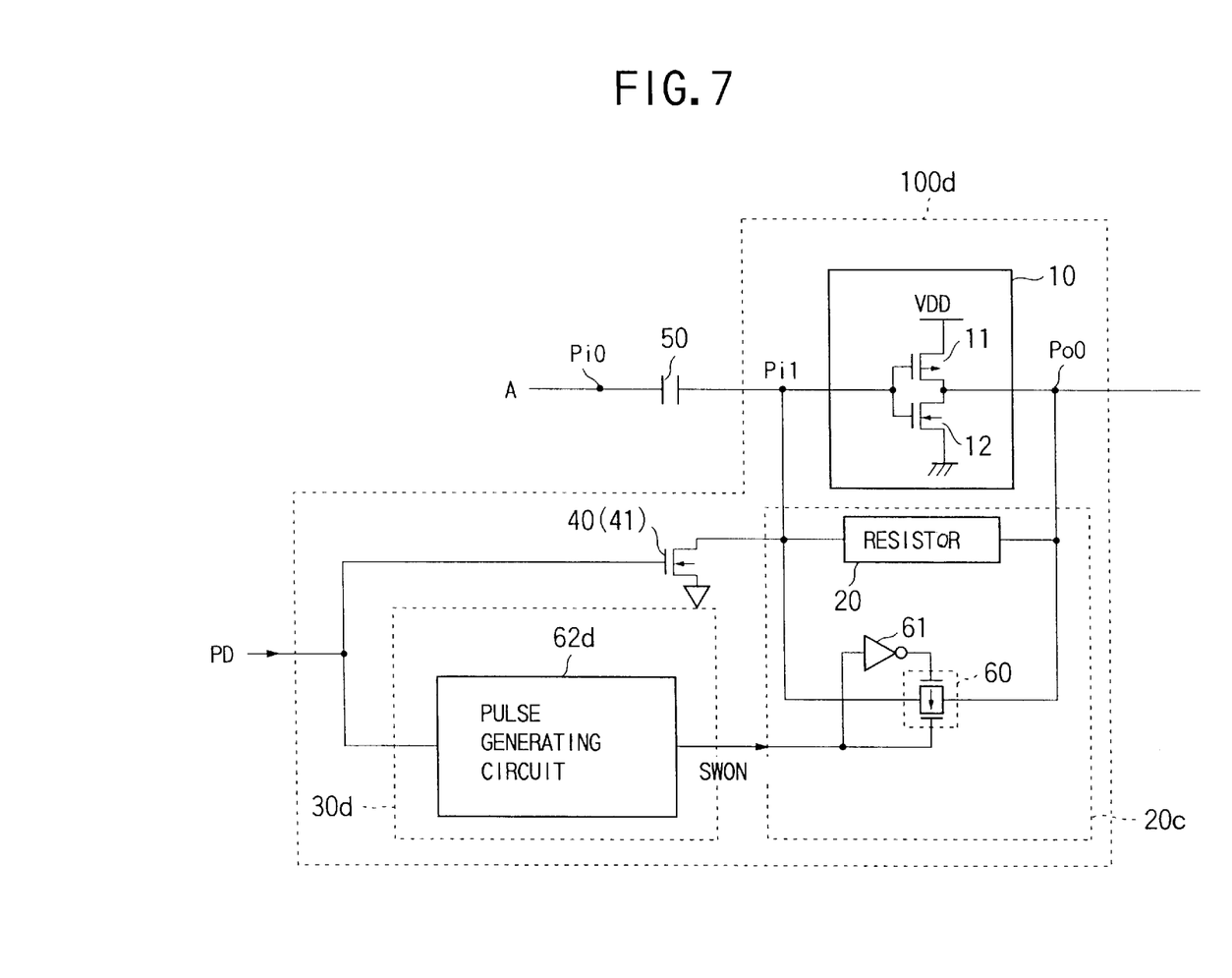
FIG. 7 is a circuit diagram illustrating an amplification circuit according to a fourth embodiment of the present invention.

Referring to FIG. 7, an amplification circuit 100*d* has the amplifying unit 10, the feedback resistor circuit 20*c*, a control circuit 30*d* and the power-save circuit 40. The feedback resistor circuit 20*c* has the resistor 20 and the resistor unit formed of the transfer gate 60 and the inverter 61 in the same manner as that shown in FIG. 6. The control circuit 30*d* has a pulse generating circuit 62*d* and controls the resistor unit connected to the resistor 20 in parallel in the feedback resistor circuit 20*c*.

In the amplification circuit 100*d*, the power-save signal is supplied to the power-save circuit 40 and the control circuit 30*d*. When the power-save signal PD is changed from the high level to the low level, the pulse generating circuit 62*d* supplies the activating signal SWON having the high level to the transfer gate 60 in the feedback resistor circuit 20*c*. The activating signal SWON is maintained at the high level for a time period needed to restore the potential level at the input node Pi1 to about ½ VDD which is the operating threshold level. The transfer gate 60 is turned on by the activating signal SWON, having the high level, generated by the pulse generating circuit 62*d*.

The amplifying unit 10, the feedback resistor circuit 20*c* and the power-save circuit 40 have the same structures as those described above.

Figure 4:
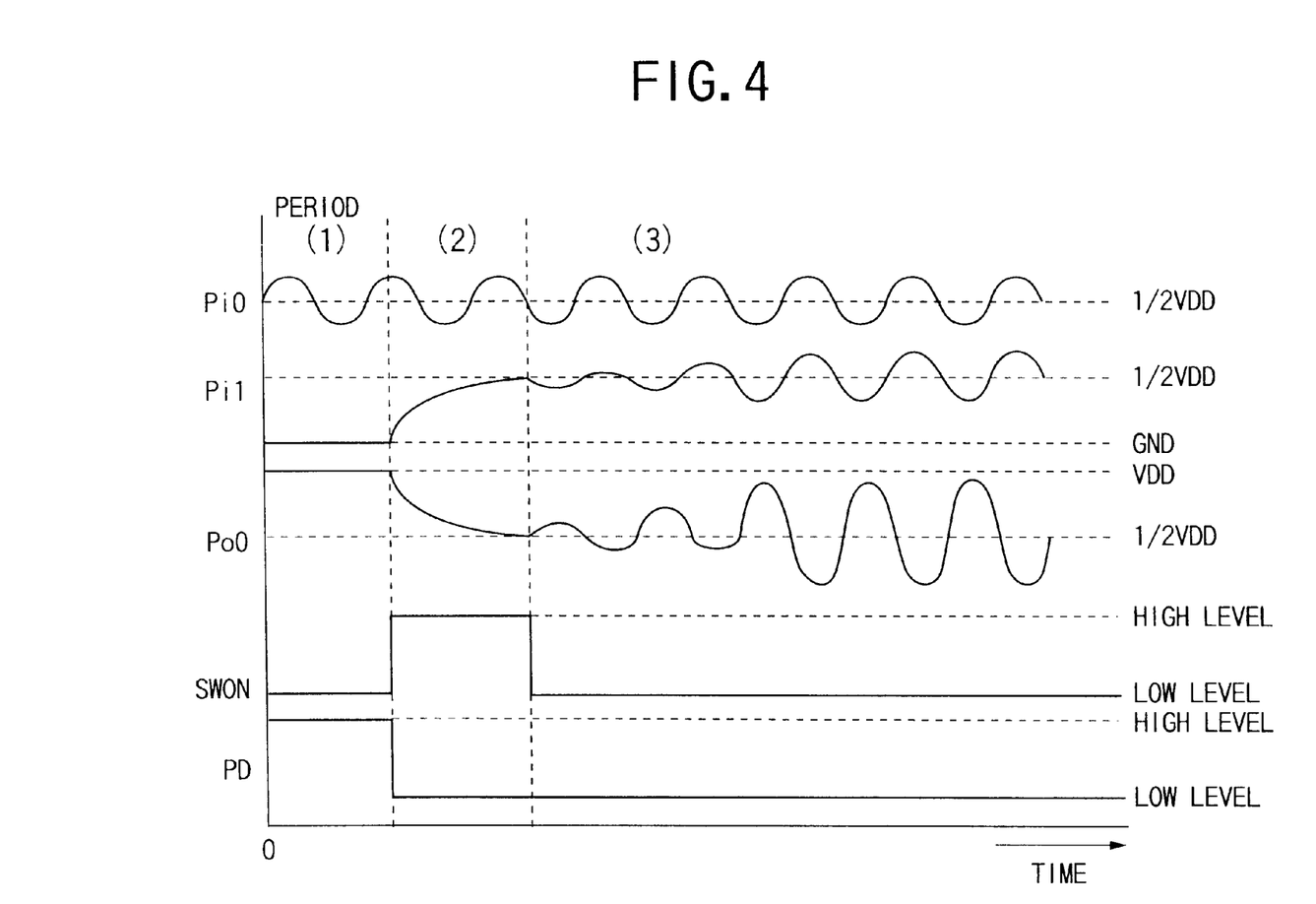
FIG. 4 is a timing chart illustrating a relationship among potentials at nodes in the amplification circuit, an activating signal SWON and power-save signal PD.

As shown in FIG. 4, when the power-save signal PD is changed from the high level to the low level, the pulse generating circuit 62*d* outputs the activating signal SWON having the high level so that the transfer gate 60 is turned on. The electric charge is thus rapidly supplied from the output node Po0 having the potential level of VDD to the input node Pi1 having the potential level of zero. As a result, the potential level at the input node Pi1 is rapidly restored to about ½ VDD which is the operating threshold level of the amplifying unit 10.

After the potential level at the input node Pi1 is restored to about ½ VDD, the pulse generating circuit 62 generates the activating signal SWON having the low level so that the transfer gate 60 is turned off. As a result, the resistance value of the feedback resistor circuit 20*c* returns to the original value (the combined resistance value of the resistor 20 and the resistor unit formed of the transfer gate 60 and the inverter 61). Thus, the amplifying operation of the amplification circuit 100d can rapidly start and the amplification circuit 100d can amplify the signal with a low consumed power and a high amplification factor. In addition, the amplification circuit 100d can be controlled by only the power-save signal PD.

Figure 8:
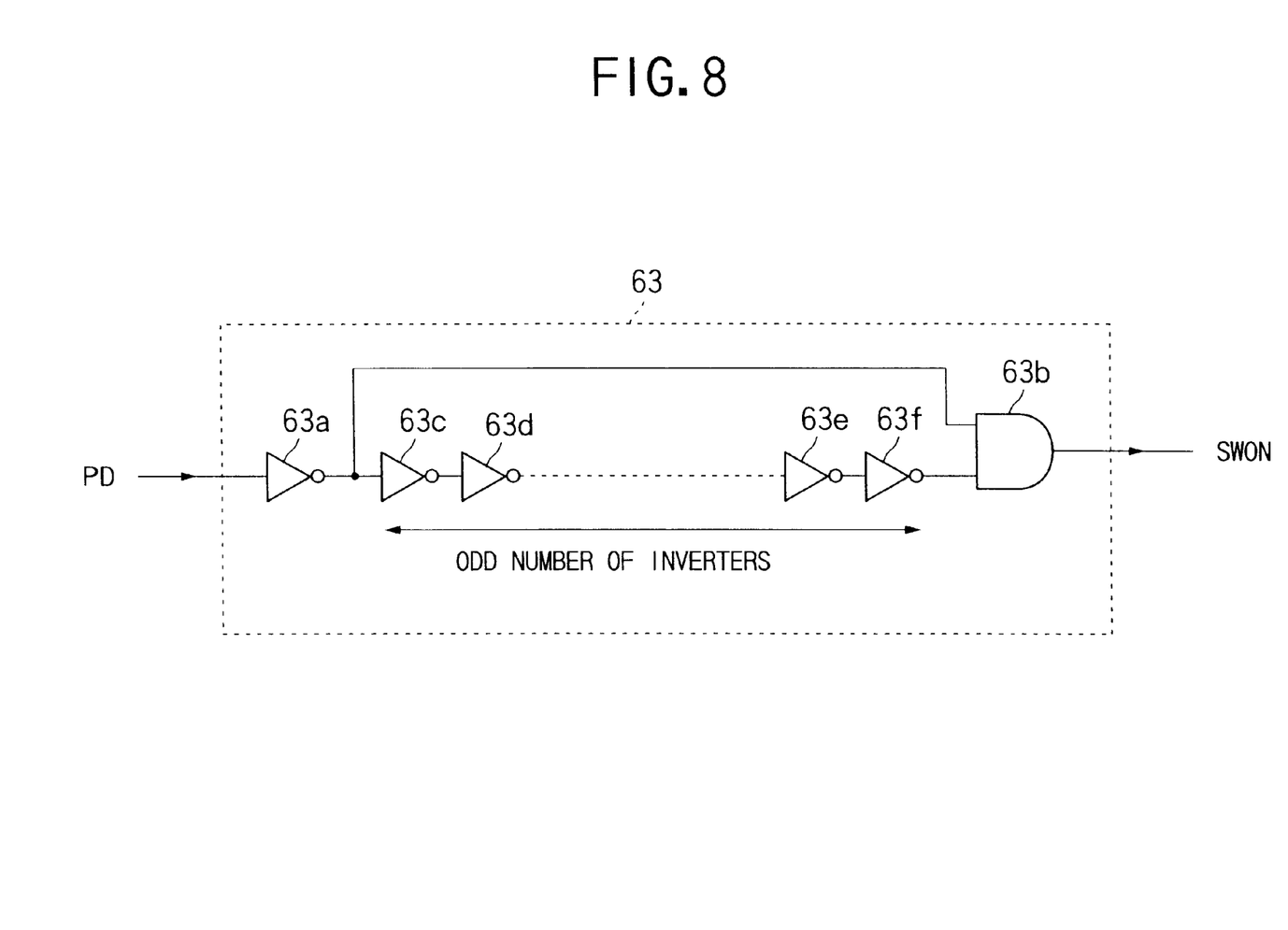
FIG. 8 is a circuit diagram illustrating an example of a pulse generating circuit.
Figure 9:
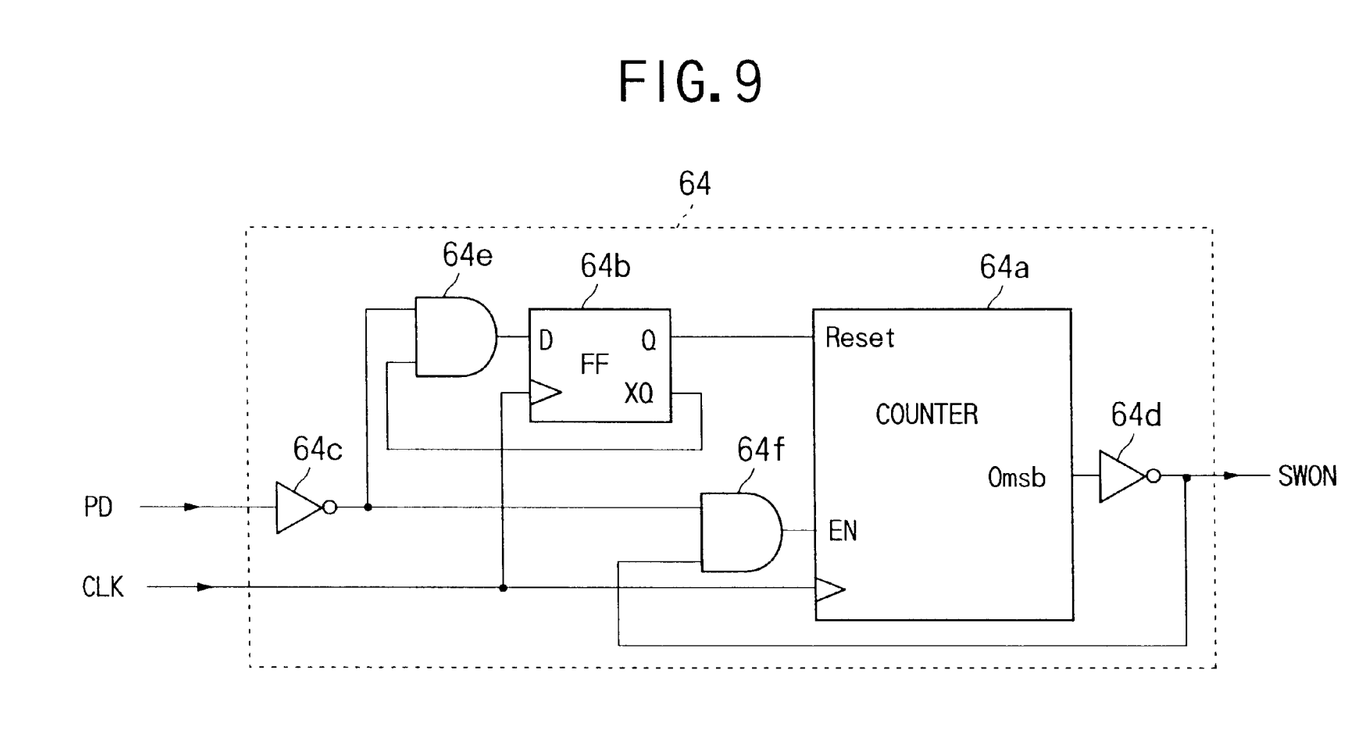
FIG. 9 is a circuit diagram illustrating another example of the pulse generating circuit.

The pulse generating circuit 62 of the amplification circuit 100d may be implemented using a ring oscillator 63 simply formed as shown in FIG. 8 or a circuit 64 having a counter as shown in FIG. 9.

Referring to FIG. 8, the ring oscillator 63 is formed of an inverter 63a, an AND circuit 63b and an odd number of inverter 63c–63f connected between the inverter 63a and the AND circuit 63b. The delay time T is required for the signal input to the inverter 63c to be inverted and output by the inverter 63f. Thus, when the power-save signal is changed from the high level to the low level, the AND circuit 63b outputs the activating signal SWON which is maintained at the high level for the time period T. The odd number of inverters may be adjusted so that the delay time T corresponds to the time needed to restore the potential level at the input node Pi1 to about ½ VDD.

Referring to FIG. 9, the circuit 64 is formed of a counter 64a, a D-flip-flop 64b, inverters 64c and 64d and AND circuits 64e and 64f. The D-flip-flop 64b outputs, from an output terminal Q, a signal input to an input terminal when a clock CLK is input. In the circuit 64, when the powersave signal input to the inverter 64c is changed from the high level to the low level, a reset signal is supplied from the D-flip-flop 64b to a reset terminal of the counter 64a. When the reset signal is input to the counter 64a, the counter 64a outputs a signal having a low level from a terminal Qmsb. The signal having the low level is inverted by the inverter 64d. The output signal of the inverter 64d is then output as the activating signal SWON having the high level.

The structure of the pulse generating circuit 62d is not limited to those shown in FIGS. 8 and 9. The pulse generating circuit 62d may have other structures.

A description will now be given, with reference to FIG. 10, of the amplification circuit according to a fifth embodiment of the present invention.

Figure 10:
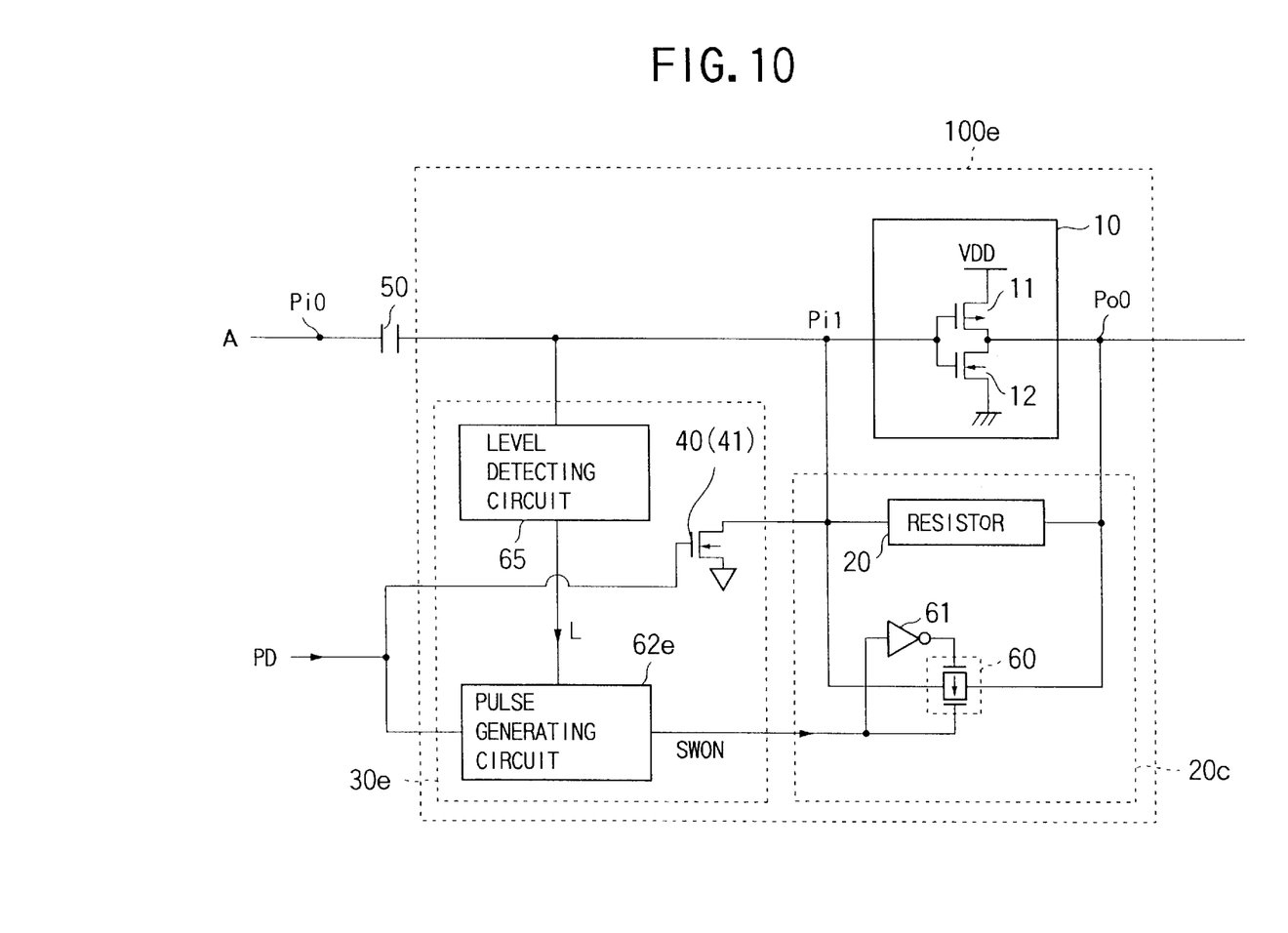
FIG. 10 is a circuit diagram illustrating an amplification circuit according to a fifth embodiment of the present invention.

Referring to FIG. 10, an amplification circuit 100e has the amplifying unit 10, the feedback resistor circuit 20c, a control circuit 30e and the power-save circuit 40. In the feedback resistor circuit 20c, the resistor 20 and the resistor unit formed of the transfer gate 60 and the inverter 61 are connected in parallel. The control circuit 30e has a pulse generating circuit 62e and a level detecting circuit 65.

The level detecting circuit 65 detects the potential level at the input node Pi1. The level detecting circuit 65 outputs a detecting signal L having a low level until the potential level at the input node Pi1 is restored to about ½ VDD. When the potential level at the input node Pi1 reaches about ½ VDD, the level detecting circuit 65 outputs the detecting signal L having a high level.

In the amplification circuit 100e, the power-save signal PD is supplied to the power-save circuit 40 and the pulse generating circuit 62e in the control circuit 30e. The pulse generating circuit 62e outputs the activating signal SWON having the high level maintained from a time at which the power-save signal PD is changed from the high level to the low level to a time at which the level detecting circuit 65 outputs the detecting signal L having the high level. The transfer gate 60 in the feedback resistor circuit 20c is turned on by the activating signal having the high level.

The amplifying unit 10 and the power save circuit 40 have the same structures as those in the amplification circuits described above.

A description will now be given, with reference to FIG. 11, of operations of the amplification circuit 100e.

Figure 11:
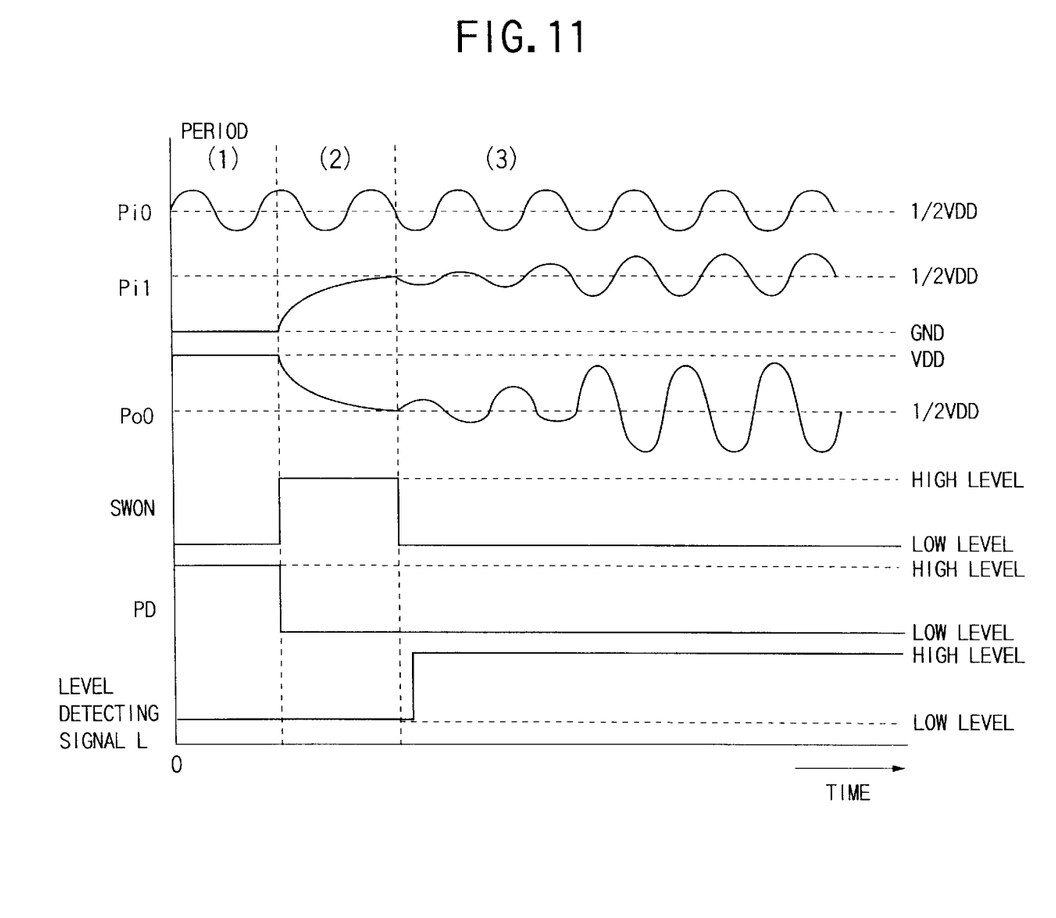
FIG. 11 is a timing chart illustrating a relationship among potentials at nodes in the amplification circuit, an activating signal SWON, a power-save signal PD and a level detecting signal.

Referring to FIG. 11, first, in a period (1), when the power-save signal PD having the high level is input to the power-save circuit 40, the transistor 41 is turned on and the potential level at the input node Pi1 is clamped at zero. At this time, the transistor 11 of the amplifying unit 10 is turned on and the transistor 12 is turned off. As a result, the potential level at the output node Po0 is controlled be to the power supply voltage VDD.

Next, in the period (2), since the power-save signal PD having the low level is supplied to the power-save circuit 40, the transistor 41 is turned off. The pulse generating circuit 62e generates the activating signal SWON having the high level when the power-save signal PD is changed from the high level to the low level so as to cause the transfer gate 60 to be turned on. The electric charge is thus rapidly supplied from the output node Po0 having the potential level of VDD to the input node Pi1 having the potential level of zero, so that the potential level at the input node Pi1 is rapidly restored to about ½ VDD which is the operating threshold level of the amplifying unit 10. While the electric charge is being supplied to the input node Pi1, the potential level at the output node Po0 is decreased so as to be balanced with the potential level at the input node Pi1.

At this time, the level detecting circuit 65 detects that the potential level at the input node Pi1 has been restored to about ½ VDD and supplies the detecting signal L having the high level to the pulse generating circuit 62e. The pulse generating circuit 62e which receives the detecting signal L having the high level from the level detecting circuit 65 changes the level of activating signal SWON to the low level, so that the transfer gate 60 is turned off.

Then, in a period (3), the signal A input to the amplification circuit 100e via the AC coupling capacitor 50 is inverted and amplified by the amplifying unit 10. The output signal of the amplifying unit 10 is then output via the output node Po0.

As has been described above, the pulse generating circuit 62e generates the activating signal SWON having the high level maintained from a time at which the power-save signal PD becomes the low level to a time at which the potential level at the input node Pi1 is restored to about ½ VDD and the transfer gate 60 is in the on state. While the transfer gate 60 is in the one state, the potential level at the input node Pi1 is rapidly restored from zero to the operating threshold level of the amplifying unit 10. Thus, the amplifying operation can rapidly start. In addition, when the amplification circuit 100e executes the amplifying operation, the transfer gate 60 is in the off state so that the resistance value of the feedback resistor circuit 20c returns the original value (the large value). Thus, the amplification circuit 100e amplifies the signal with a low consumed power and a high signal amplification factor. Further, in the amplification circuit 100e, since the level detecting circuit 65 informs the pulse generating circuit 62e that the potential level at the input node Pi1 has been restored to about ½ VDD, the pulse generating circuit 62e has no need of a constitution for setting a time period for which the activating signal SWON is maintained at the high level.

Figure 12:
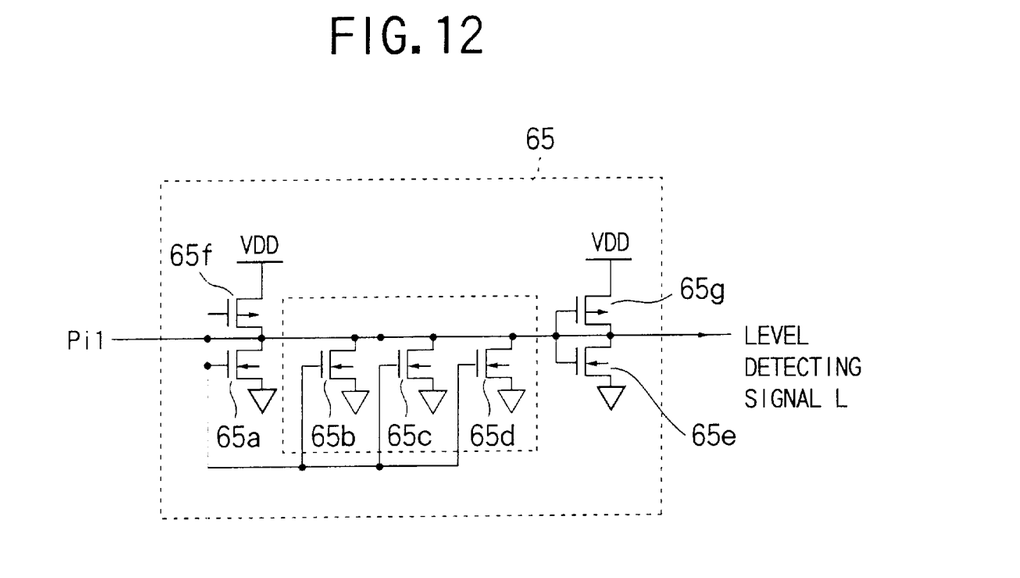
FIG. 12 is a circuit diagram illustrating an example of a level detecting circuit.

The level detecting circuit may formed, as shown in FIG. 12, using N-channel transistors 65a, 65b, 65c, 65d and 65e and P-channel transistors 65f and 65g. The source terminals of the P-channel transistors 65f and 65g are connected to the power supply voltage line VDD. The source terminals of the N-channel transistors 65a, 65b, 65c, 65d and 65e are grounded.

While the potential level at the input node Pi1 is being restored from zero to about ½ VDD, the transistors 65a, 65b, 65c, 65d and 65g are in the off state and the transistors 65f and 65e are in the on state. Thus, the level detecting circuit 65 outputs the detecting signal L having the low level. In addition, when the input node Pi1 is restored to about ½ VDD, the transistors 65a, 65b, 65c, 65d and 65g are turned on and the transistors 65f and 65e are turned off. Thus, the level detecting circuit 65 outputs the level detecting signal L having the high level.

Figure 13:
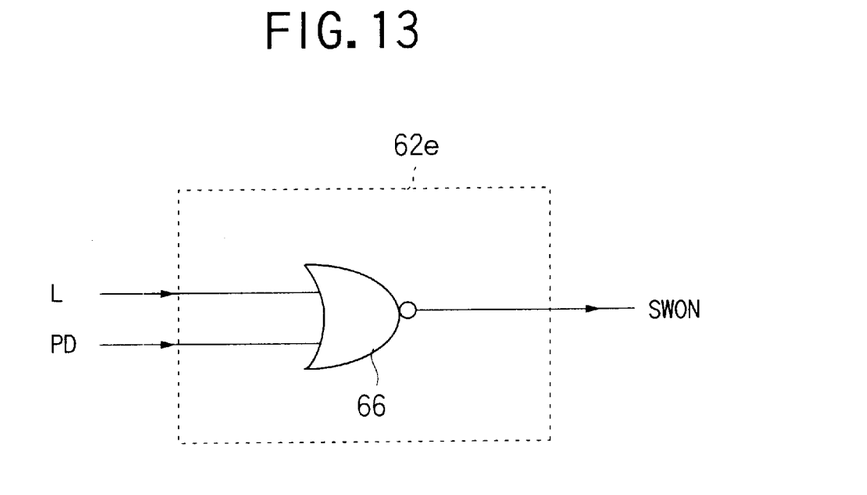
FIG. 13 is a circuit diagram illustrating another example of the pulse generating circuit.

The pulse generating circuit 62e in the amplification circuit 100e may be formed, as shown in FIG. 13, using a NOR circuit 66. Due to a function of the NOR circuit 66, when the power-save signal PD and the detecting signal L from the level detecting signal have the low level, the activating signal SWON having the high level is output.

The structures of the level detecting circuit 65 and the pulse generating circuit 62e are not limited to those shown in FIGS. 12 and 13. They may have other structures having the same functions.

In the above embodiments, the amplifying unit 10 is the inverter amplifier. However, the amplifying unit may have another structure. Further, the present invention may be applied to another circuit in which the operating threshold level depends on the resistance value of the feedback resistor circuit.

The present invention is not limited to the aforementioned embodiments, and other variations and modifications may be made without departing from the scope of the claimed invention.

The present application is based on Japanese priority application No. 10-263580 filed on Sep. 17, 1998, the entire contents of which are hereby incorporated by reference.

What is claimed is:

1. An amplification circuit comprising:
an amplifying unit to which a signal supplied via an AC coupling capacitor is input, said amplifying unit starting an amplifying operation for the input signal when a potential level at an input portion of said amplifying unit reaches an operating threshold level from a predetermined low level; and
a feedback resistor circuit, provided in a feedback line through which an electric charge is fed back to the input portion of said amplifying unit, in which feedback resistor circuit a resistance value is controllable by a control signal,
wherein a resistance of the feedback line during a predetermined time after the amplifying operation is started is less than a resistance of the feedback during signal amplification after the predetermined time.

2. The amplification circuit as claimed in claim 1, wherein said feedback resistor circuit has an adjustable resistor in which the resistance value is controllable by the control signal.

3. The amplification circuit as claimed in claim 1, wherein said feedback resistor circuit has a transfer gate provided in the feedback line, said transfer gate being turned on and off by the control signal.

4. The amplification circuit as claimed in claim 1, wherein said feedback resistor circuit has a resistor and a resistor unit in which a resistance value is controllable by the control signal, said resistor and said resistor unit being connected in parallel.

5. The amplification circuit as claimed in claim 4, wherein said resistor unit has a transfer gate provided in the feedback line, said transfer gate being turned on and off by the control signal.

6. The amplification circuit as claimed in claim 1 further comprising:
a control circuit that generates the control signal, to be supplied to said feedback resistor circuit, based on a predetermined signal.

7. A amplification circuit comprising:
an amplifying unit to which a signal supplied via an AC coupling capacitor is input, said amplifying unit starting an amplifying operation for the input signal when a potential level at an input portion of said amplifying unit reaches an operating threshold level from a predetermined low level;
a feedback resistor circuit, provided in a feedback line through which an electric charge is fed back to the input portion of said amplifying unit, in which feedback resistor circuit a resistance value is controllable by a control signal, and
a control circuit that generates the control signal, to be supplied to said feedback resistor circuit, based on a predetermined signal,
wherein the predetermined signal supplied to said first control circuit is a signal used to release the input portion of said amplifying unit from a state where the input portion is maintained at the predetermined low level.

8. A amplification circuit comprising:
an amplifying unit to which a signal supplied via an AC coupling capacitor is input, said amplifying unit starting an amplifying operation for the input signal when a potential level at an input portion of said amplifying unit reaches an operating threshold level from a predetermined low level;
a feedback resistor circuit, provided in a feedback line through which an electric charge is fed back to the input portion of said amplifying unit, in which feedback resistor circuit a resistance value is controllable by a control signal; and
a control circuit that generates the control signal, to be supplied to said feedback resistor circuit, based on a predetermined signal,
wherein the control signal generated by said control circuit has a first state and a second state, said feedback resistor circuit being controlled by the control signal having the first state so as to have a first resistance value and by the control signal having the second state so as to have a resistance value larger than the first resistance value.

9. The amplification circuit as claimed in claim 8, wherein said control circuit outputs the control signal having the first state when a state where the potential level at the input portion of said amplifying unit is maintained at the predetermined low level is released, the first state of said control signal being switched to the second state when the potential level at the input portion of said amplifying unit reaches the operating threshold level by supplying the electric charge to the input portion via said feedback resistor circuit.

10. The amplification circuit as claimed in claim 9, wherein said control circuit comprises
a circuit that maintains the control signal in the first state from a time at which the state where the input portion of said amplifying unit is maintained at the predetermined low level is released to a time at which the potential level at the potential level at the input portion reaches the operating threshold level.

11. The amplification circuit as claimed in claim 9, wherein said control circuit comprises:

a detecting circuit detecting whether the potential level at the input portion of said amplifying unit reaches the operating threshold level from the predetermined low level; and a circuit switching the first state of the control signal to the second state when said detecting circuit detects that the potential level at the input portion reaches the operating threshold level.

12. An amplification circuit comprising:

an amplifying unit to which a signal supplied via an AC coupling capacitor is input, said amplifying unit starting an amplifying operation for the input signal when a potential level at an input portion of said amplifying unit reaches an operating threshold level from a predetermined low level;

a feedback resistor circuit, provided in a feedback line through which an electric charge is fed back to the input portion of said amplifying unit, in which feedback resistor circuit a resistance value is controllable by a control signal; and a power-save circuit which is operable in response to a power-save signal, said power-save circuit maintaining a state where the potential level at the input portion of said amplifying unit is maintained at the predetermined low level when the power-save signal is in a first state, and releasing the state when the power-save signal is in a second state.

13. A semiconductor integrated circuit comprising:

a plurality of circuits which have predetermined functions; and an amplification circuit coupled to one of said plurality of circuits as an input circuit for said one of said plurality of circuits, said amplification circuit comprising:

an amplifying unit to which a signal supplied via an AC coupling capacitor is input, said amplifying unit starting an amplifying operation for the input signal when a potential level at an input portion of said amplifying unit reaches an operating threshold level from a predetermined low level; and a feedback resistor circuit, provided in a feedback line through which electric charge is fed back to the input portion of said amplifying unit, in which feedback resistor circuit a resistance value is controllable by a control signal.

14. A method for controlling an amplification circuit having an amplifying unit to which a signal supplied via an AC coupling capacitor is input, said amplifying unit starting an amplifying operation for the input signal when a potential level at an input portion of said amplifying unit reaches an operating threshold level from a predetermined low level; and a feedback resistor circuit, provided in a feedback line through which electric charge is fed back to the input portion of said amplifying unit, in which feedback resistor circuit a resistance value is controllable by a control signal, said method comprising of the steps of:

(a) maintaining a state where the potential level at the input portion of said amplifying unit is maintained at the predetermined low level;

(b) controlling the resistance value of said feedback resistor circuit at a first value when said state of the potential level at the input portion of said amplifying unit is released; and (c) controlling the resistance value of said feedback resistor circuit at a second value larger than the first value when the potential level of the input portion of said amplifying unit reaches the operating threshold level.

15. An amplification circuit comprising:

an amplifying unit to which a signal supplied via an AC coupling capacitor is input, said amplifying unit starting an amplifying operation for the input signal when a potential level at an input portion of said amplifying unit reaches an operating threshold level from a predetermined low level; and a feedback resistor circuit, provided in a feedback line through which an electric charge is fed back to the input portion of said amplifying unit, in which feedback resistor circuit a resistance value is controllable by a control signal;

wherein said feedback resistor circuit comprises a resistor unit consisting of an inverter and a transfer gate.

16. The amplification circuit as claimed in claim 15, wherein said transfer gate is provided in the feedback line, said transfer gate being turned on and off by the control signal.

17. The amplification circuit as claimed in claim 15, wherein said feedback resistor circuit further includes a resistor connected in parallel with said resistor unit in which a resistance value is controllable by the control signal.

18. The amplification circuit as claimed in claim 17, wherein said transfer gate is provided in the feedback line, said transfer gate being turned on and off by the control signal.

* * * * *